United States Patent [19]
Mastrocola et al.

[11] Patent Number: 5,596,302
[45] Date of Patent: Jan. 21, 1997

[54] RING OSCILLATOR USING EVEN NUMBERS OF DIFFERENTIAL STAGES WITH CURRENT MIRRORS

[75] Inventors: Angelo R. Mastrocola, West Lawn; Jeffrey L. Sonntag, Rockland Township, Berks County, both of Pa.

[73] Assignee: Lucent Technologies Inc., Murray Hill, N.J.

[21] Appl. No.: 588,156

[22] Filed: Jan. 17, 1996

[51] Int. Cl.⁶ ................................................ H03B 5/24
[52] U.S. Cl. .................... 331/57; 331/117 R; 331/186
[58] Field of Search .................................. 331/8, 34, 45, 331/57, 60, 177 R, 185, 186

[56] References Cited

U.S. PATENT DOCUMENTS

| | | | |
|---|---|---|---|
| 5,300,898 | 4/1994 | Chen et al. | 331/57 |
| 5,399,995 | 3/1995 | Kardontchik et al. | 331/57 X |
| 5,420,547 | 5/1995 | Kikuchi | 331/57 |
| 5,426,398 | 6/1995 | Kuo | 331/57 |
| 5,440,277 | 8/1995 | Ewen et al. | 331/57 X |
| 5,515,012 | 5/1996 | Bhushan et al. | 331/57 X |
| 5,523,723 | 6/1996 | Arcus et al. | 331/57 X |

OTHER PUBLICATIONS

Kim, B. et al., "A 30–MHz Hybrid Analog/digital Clock Recovery Circuit in 2–μm CMOS", IEEE Journal of Solid-State Circuits, vol. 25, No. 6, Dec. 1990, pp. 1385–1394.

Primary Examiner—David Mis

[57] ABSTRACT

A ring oscillator having an even number of differential amplifier stages is disclosed wherein each stage includes a differential amplifier using two N-channel MOSFETs whose gates serve as the inputs and whose drains serve as the outputs of the stage. The sources of the two MOSFETs are connected together and to a current sink consisting of a cascoded structure of N-channel MOSFETs. The drains of each of the two N-channel MOSFETs serving as the differential amplifier are each connected to a respective current source provided by a P-channel MOSFET. All of the current sinks in the stages are connected as secondary legs of a first current mirror which establishes a current of I in the sinks. All of the current sources are connected as secondary legs of a second current mirror which attempts to establish a current of $(1+\infty)I/2$ in each of the sources, where $\infty$ is a number greater than zero. Since an average current of only I/2 can be drawn from each of the current sources, the voltage drop across each current source is reduced, thereby limiting the range of the average common mode output voltage for each stage of the oscillator.

21 Claims, 4 Drawing Sheets

RING OSCILLATOR USING EVEN NUMBERS OF DIFFERENTIAL STAGES WITH CURRENT MIRRORS

FIELD OF THE INVENTION

This invention relates to ring oscillators and more particularly to ring oscillators using an even number of differential stages.

Description of the Related Art

Ring oscillators are frequently used in the prior art to generate high frequency clock signals. Briefly, a ring oscillator consists of multiple stages of amplification and delay that are connected in tandem, with the last stage coupled back to the first stage in the form of a ring around which the signals propagate. Each stage of the ring oscillator generally provides a phase inversion, in that a shift of input voltage in one direction at the input of a stage causes the output of that stage (after a given time delay) to shift its output in the opposite direction.

It has been recognized in the prior art that it is beneficial to use differential amplifiers for each of the stages of the ring oscillator in order to cause the oscillator to be more immune to the influence of spurious noises in the form of voltage and current spikes that might be coupled to both sides of the differential circuit. Such a spurious noise from the power supply, for example, would be coupled to both sides of the differential amplifier, and it would therefore affect both of the sides of the differential stages substantially equally. Consequently, the effect of such spurious noise is minimized on the output of the oscillator, which can be taken as the difference of the outputs of any one of the stages. A prior art ring oscillator which utilizes differential amplifier stages is described in U.S. Pat. No. 5,300,898, issued Apr. 5, 1994 to D-L Chen et al. and entitled "High Speed Current/Voltage Controlled Ring Oscillator Circuit". In the Chen et al. circuit an odd number of differential stages are connected in tandem in a ring configuration.

There are some applications, such as timing recovery systems using Digital Phase-Locked Loops (DPLLs), for example, which require multiple high frequency clocks equally spaced in phase. These multiple clocks can be obtained from a single-ended ring oscillator by taking each clock output from a different stage of the ring oscillator. In the case of differential stages, each stage's differential output and its opposite can be used to provide clock outputs from the ring oscillator. For example, a differential three stage ring oscillator can be used to provide six different clock phases spaced 60 degrees apart. A ring oscillator of the type disclosed in the Chen et al. patent could be used to provide these multiple clocks.

If, however, it is desired to provide a binary power number (N) of clocks equally spaced in phase (i.e. $N=2^n$, where n is an integer), the circuit of the Chen et al. patent cannot be used since it is not able to work with an even number of stages in the ring oscillator. Any even number of stages in this circuit would simply lock up either on a differential basis or on a common mode basis. That is, each stage would end up with its output sitting respectively either at opposite voltage limits or at the same voltage limit. For example, in a simple two stage ring oscillator, differential lockup could occur with the first output of stage one and the second output of stage two sitting at one voltage limit while the second output of stage one and the first output of stage two are sitting at the opposite voltage limit. Common mode lockup could occur with the first and second outputs of stage one sitting near one voltage limit while the first and second outputs of stage two are sitting near the opposite voltage limit.

Differential mode lockup can be prevented in a ring oscillator using an even number of stages by crossing the connections made between the outputs and the inputs for one pair (or an odd number of pairs) of connections in the ring oscillator. As a result, an additional phase inversion is provided in the differential signal path, and lockup of the oscillator on a differential basis is prevented. See the article entitled "A 30-MHz Hybrid Analog/Digital Clock Recovery Circuit in 2-µm CMOS", by B. Kim, D. N. Helman and P. R. Gray, IEEE Journal of Solid-State Circuits, vol. 25, No. 6, Dec. 1990, pages 1385–1394.

FIG. 8 of the Kim et al. article shows the basic delay cell in a ring oscillator having an even number of differential stages. In this basic cell, two N-channel devices are connected in a differential arrangement with each of their drain electrodes connected through a load, consisting of a P-channel device, to one terminal of a power supply, and their source electrodes connected together through two N-channel devices connected in cascode fashion to the other terminal of the power supply. A constant current is drawn through the cascoded N-channel devices by applying bias potentials to the gate electrodes of these two devices from the bandgap current bias circuit shown in FIG. 10 of the Kim et al. article. The P-channel load devices are kept in the triode region by a servo replica biasing circuit shown in FIG. 9 of the Kim et al. article. As a result, the gates of the P-channel devices are provided with a voltage which limits the voltage swing of the delay cell to about 1 volt, and therefore the ring oscillator of the Kim et al. article is unlikely to experience common mode lockup. The reason for this outcome will become more apparent after reading the following detailed description of the present invention. Unfortunately, the devices used in the bandgap current bias circuit of FIG. 10 and the servo replica biasing circuit of FIG. 9 occupy a considerable percentage of the chip space required for the ring oscillator, especially if the ring oscillator has a small number of stages. Furthermore, the current dissipation (and therefore power) remains relatively constant for all frequencies of operation. In addition, the P-channel devices operating in the triode region are relatively susceptible to power supply noise, and are not well suited for significant adjustment in frequency.

SUMMARY OF THE INVENTION

Common mode behavior in a ring oscillator with an even number of stages is controlled by a biasing circuit using a lower percentage of chip space than in prior art ring oscillators.

In accordance with an embodiment of the present invention, each of the stages in the ring configuration includes two current sources and a current sink which deliver current to, and draw current from, a pair of semiconductor devices which provide the differential amplification for the stage. The current sinks and current sources of all of the stages are connected as secondary legs (that is, current-mirrored branches) of first and second current mirrors having primary legs in a bias control circuit which establishes the potentials that are applied to the current sources and sinks in all of the stages. The first current mirror provides a potential to the current sinks in all of the stages that establishes a current of I in the current sinks. All of the current sources are connected as secondary legs of a second current mirror which is constructed to establish a current of $(1+\infty)I/2$ in each of the sources, where $\infty$ is a number greater than zero. Since an average of only $I/2$ is drawn by the current sink from each of the respective two current sources, the potential drop across the semiconductor devices serving as the current sources changes to a lower potential drop corresponding to the lower current. As a result, the minimum average common mode output voltage of each stage in the ring oscillator is raised to a higher limit than it otherwise would be, and this in turn places a limit on the maximum average common mode voltage at the output of the subsequent stage. These limitations in the swing of the average common mode input and output voltages prevent the ring oscillator from locking up on a common mode basis.

It is an aspect of the present invention that the first current mirror is constructed with an additional secondary leg having a current of $(130 \infty)I$ which additional secondary leg in turn is coupled as a source of current for the primary leg of the second current mirror.

It is an additional aspect of the present invention that the primary leg of the first current mirror, each current sink, and the additional secondary leg are all cascoded structures of semiconductor MOSFET devices. The MOSFET devices in the additional secondary leg are fabricated with channel width to length (W/L) ratios that are larger by a factor of $(1+\infty)$ than those of the MOSFET devices in the primary leg of the first current mirror. As a result, the additional secondary leg provides a current of $(1+\infty)I$ to the primary leg of the second current mirror.

Preferably, the entire ring oscillator is fabricated entirely in CMOS with complementary metal oxide semiconductor transistors (MOSFETs) operating between two potential rails provided by an external power source. An external control potential is applied to control the currents in sinks and sources of each stage, and changing this potential changes the frequency (and amplitude) at which the ring oscillator operates.

Additional advantages of the invention include fast operation, low parasitic loading, low power consumption, and accommodation of significant adjustments to frequency, all without complex control circuitry.

DESCRIPTION OF THE PREFERRED EMBODIMENT

Figure 1:
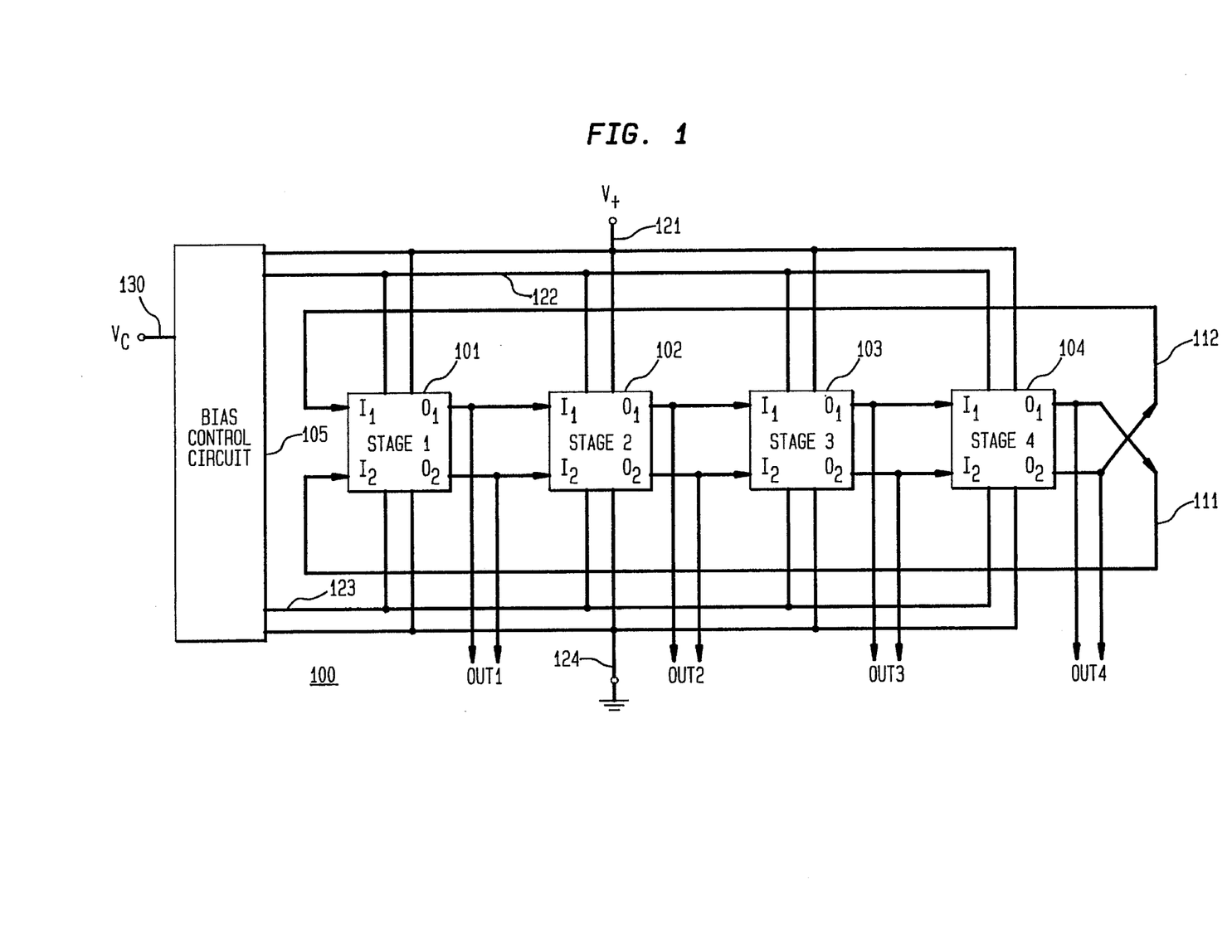
FIG. 1 is a schematic block diagram of a ring oscillator constructed in accordance with the present invention.

A schematic block diagram of a ring oscillator 100 constructed in accordance with the present invention is shown in FIG. 1. A first stage 101 of the ring oscillator 100 has its first and second outputs, $O_1$ and $O_2$, connected respectively to the first and second inputs, $I_1$ and $I_2$, of a second stage 102. Similarly, the outputs of the second stage 102 are connected to the inputs of a third stage 103, and the outputs of the third stage 103 are connected to the inputs of a fourth stage 104 in FIG. 1. All of the stages are powered by an external potential source which supplies a positive voltage, $V_+$, on a line 121 with respect to a reference ground on line 124. In addition, a bias control circuit 105 is also powered by the external potential source on line 121, and this bias control circuit provides two bias potentials, $V_{BP}$ and $V_{BN}$, by way of lines 122 and 123, respectively, to each of the four oscillator stages 101–104. The values of the bias potentials provided by the bias control circuit 105 are dependent on the value of the external control voltage, $V_C$, that is coupled to circuit 105 by way of line 130. In brief, changing this control voltage changes the bias potentials which in turn changes the amount of current in both current sources and a current sink in each of the stages to be described hereinafter, thereby causing a change in the frequency, and to some extent, the amplitude of oscillation.

To prevent differential lockup, the two outputs of the fourth stage 104 are not connected in the same direct way to the inputs of the first stage 101. Instead, the first output, $O_1$, of the fourth stage 104 is connected by way of line 111 to the second input, $I_2$, of the first stage 101, and the second output, $O_2$, of the fourth stage 104 is connected by way of line 112 to the first input, $I_1$, of the first stage 101. This cross coupling of the differential signals places an additional phase inversion in the differential signals and from a differential standpoint allows the even number of stages to oscillate. Unfortunately, this cross coupling does nothing to prevent the stages from locking up on a common mode basis. Simply stated, if both of the outputs of a given stage are being driven toward the same voltage limit as occurs in common mode lockup, it does little good to cross the outputs. As a result, the present invention employs cross coupling to prevent differential lock up, and employs a novel circuit arrangement to prevent any common mode lockup from occurring.

Figure 2:
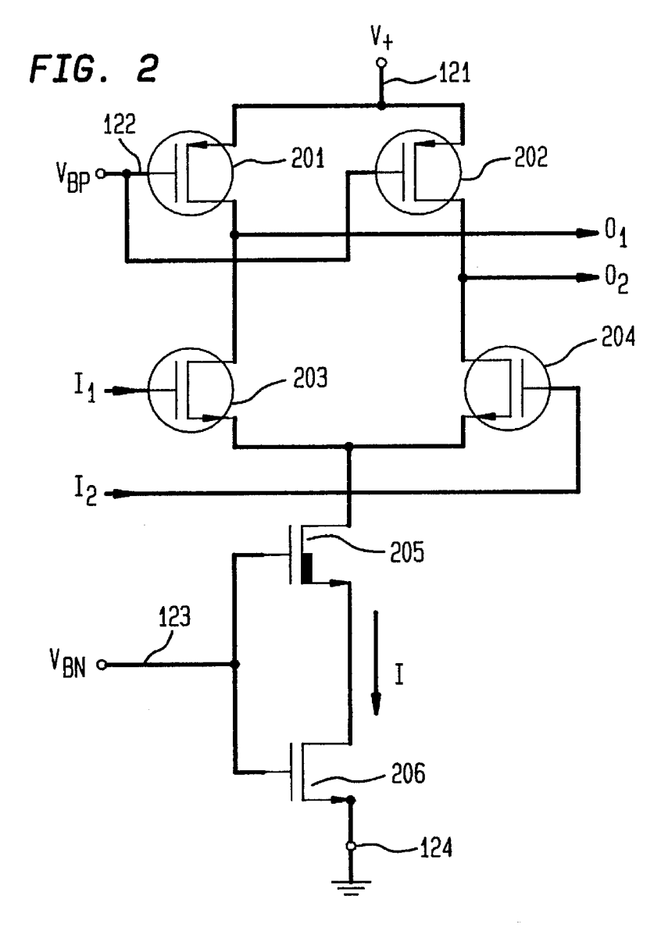
FIG. 2 is a schematic diagram of one stage of the ring oscillator constructed in accordance with the invention.

All of the stages of the ring oscillator are identical in construction and therefore only one of the stages need be described in detail. A schematic diagram of stage 101 is shown in FIG. 2. In FIG. 2, the bias potential $V_{BP}$ from the bias control circuit 105 is coupled by way of line 122 to the gate electrodes of two P-channel metal oxide semiconductor field effect transistors (MOSFETs) 201 and 202. The source electrodes of each of these MOSFETs 201 and 202 are connected to line 121 which supplies the positive voltage $V_+$. Consequently, each of these MOSFETs 201 and 202 serves as a current source which supplies a current at its respective drain electrode, the value of which current is dependent on the value of the bias potential at its gate electrode relative to its source and on the magnitude of the voltage between its drain and source, $V_{DS}$.

Two N-channel MOSFETs 203 and 204 are connected as a differential amplifier pair with their source electrodes connected together and each drain electrode connected to receive one of the currents from the current sources provided by the drain electrodes of MOSFETs 201 and 202 respectively. The directly connected source electrodes of MOSFETs 203 and 204 are connected to a current sink provided by two N-channel MOSFETs 205 and 206 connected in a cascode arrangement. That is, the sources of MOSFETs 203 and 204 are connected to the drain of MOSFET 205, the source of MOSFET 205 is connected to the drain of MOSFET 206, and the source of MOSFET 206 is connected to line 124, which provides a reference ground. MOSFET 20B is fabricated to have a sufficiently lower threshold voltage, $V_T$, than that of MOSFET 206, and is sized appropriately so that MOSFET 206 is operating in the saturation region. As is well known to those skilled in the art, this type of cascode connection provides a current sink (or source) with a much lower conductance (or higher impedance) than would be available from a single MOSFET. Such a cascoded current sink (or source) is capable of maintaining the value of its current at a more constant level through a larger change in potential at its output than is an uncascoded current sink (or source).

The bias potential $V_{BN}$ from the bias control circuit 105 is connected by line 123 to the gate electrodes of MOSFETs 205 and 206. The amount of current drawn by the current sink is, of course, dependent on the bias potential, $V_{BN}$.

Figure 3:
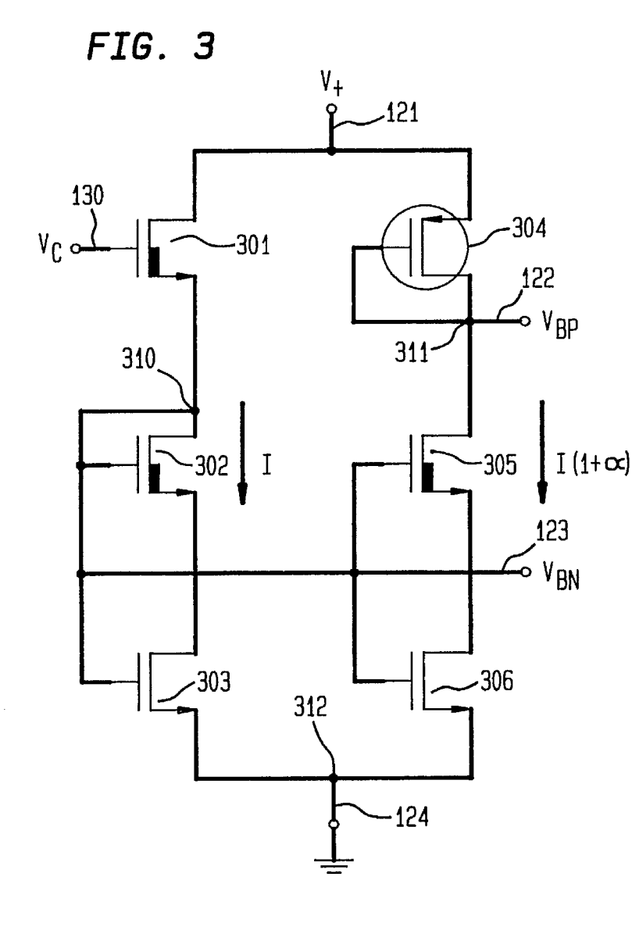
FIG. 3 is a schematic diagram of the bias control circuit constructed in accordance with the present invention.

In the differential amplifier of FIG. 2, as in FIG. 3 to follow, the MOSFETs with circles around them in the figures (201–204 and 304) are fabricated in an essentially circular gate configuration such that the stray capacitance between the drain and AC ground is reduced. This type of construction permits the circuits to operate at frequencies higher than they would by using the usual striped gate fabrication.

The first and second inputs, shown as $I_1$ and $I_2$ in FIG. 2 are connected to the gates of MOSFETs 203 and 204 respectively, and the outputs, $O_1$ and $O_2$, are provided by the drains of MOSFETs 203 and 204 respectively. In general, as the differential input potential $(I_1-I_2)$ becomes more positive, the differential output potential $(O_1-O_2)$ becomes more negative. Conversely, if the differential input potential $(I_1-I_2)$ becomes more negative, the differential output potential $(O_1-O_2)$ becomes more positive. Stated simply, each stage of the ring oscillator provides signal inversion of the differential input signal to its differential output signal. The cross coupling mentioned hereinabove provides another differential signal inversion in order to prevent differential lockup.

A schematic diagram of the bias control circuit 105 is shown in FIG. 3. In FIG. 3, a low threshold N-channel MOSFET 301 has its gate connected by way of line 130 to an external control voltage, $V_C$, and its drain connected by way of line 121 to the positive voltage $V_+$. The source of MOSFET 301 is connected to the drain and gate of an N-channel diode-connected MOSFET 302, whose source is connected to the drain of an N-channel MOSFET 303, the source of which is connected to reference ground. Accordingly, MOSFETs 301, 302 and 303 provide a conversion from voltage $V_C$ to a current I, the value of current I being dependent on the external control voltage, $V_C$. Here again, as in the case of MOSFET 205, MOSFET 302 is fabricated to have a sufficiently lower threshold voltage, $V_T$, than that of MOSFET 303, and is sized appropriately so that MOSFET 303 is operating in the saturation region. Therefore the gate of MOSFET 302 may be connected directly to the gate of MOSFET 303.

A current mirror is established between MOSFETs 302 and 303 and two N-channel MOSFETs 305 and 306 which are connected in the same way as MOSFETs 302 and 303 with respect to ground with the gates of MOSFETs 305 and 306 connected directly to the gates of MOSFETs 302 and 303. However, MOSFET 305 is not connected as a diode. Here again, MOSFET 305 is fabricated to have a sufficiently lower threshold voltage, $V_T$, than that of MOSFET 306, and is sized appropriately so that MOSFET 306 is operating in the saturation region. For purposes of this application, the circuit into which the current of the current mirror is established or pulled (the circuit between nodes 310 and 312 including MOSFETs 302 and 303, for example) is said to constitute the primary leg of the current mirror. The circuit through which the current is mirrored (the circuit between nodes 311 and 312 including MOSFETs 305 and 306, for example) is said to be a secondary leg of the current mirror. Assuming that the devices are ideal and that there are no impediments to the current flow, the current in the secondary leg is typically equal to, or some proportional value of, the current in the primary leg.

In accordance with the present invention, the channel width to length (W/L) ratios in MOSFETs 305 and 306 are fabricated to be larger than the channel W/L ratios for MOSFETs 302 and 303 by a factor of $(1+\infty)$, where $\infty$ is a number greater than zero. In the embodiment constructed, $\infty$ was equal to 0.05. Consequently, if the current established through MOSFETs 302 and 303 by control voltage $V_C$ is represented by I, then the current established into the current sink provided by the drain of MOSFET 305 can be represented by $(1+\infty)$I. This current of $(1+\infty)$I into the drain of MOSFET 305 is drawn from a diode-connected P-channel MOSFET 304 whose source is connected to positive voltage source $V_+$ on line 121.

MOSFET 304 is actually two devices connected in parallel, each of which is fabricated to be essentially identical to MOSFETs 201 and 202 in FIG. 2. By connecting the potential $V_{BP}$ at the gate and drain of MOSFET 304 by way of line 122 to the gates of MOSFETs 201 and 202 in each of the oscillator stages, MOSFETs 201 and 202 are secondary legs of a current mirror whose primary leg is MOSFET 304. Accordingly, the MOSFETs 201 and 202 in each of the stages will each attempt to draw a current of $(1+\infty)$I/2, since each is presented with a gate-to-source potential, $V_{GS}$, equal to the one established on MOSFET 304. Similarly, by connecting the bias potential $V_{BN}$ by way of line 123 to the gates of MOSFETs 205 and 206 in each of the oscillator stages, the circuitry including the MOSFETs equivalent to 205 and 206 in each of the stages is a secondary leg in the current mirror whose primary leg consists of the circuit between nodes 310 and 312 including MOSFET 302 and 303. Accordingly, MOSFETs 205 and 206 will draw a current of I since they are essentially identical in construction to MOSFETs 302 and 303. Furthermore, since the cascode connection of MOSFETs 205 and 206 has significantly higher output impedance than MOSFETs 201 or 202, the combined currents of MOSFETs 201 and 202 is forced down to I.

Figure 7:
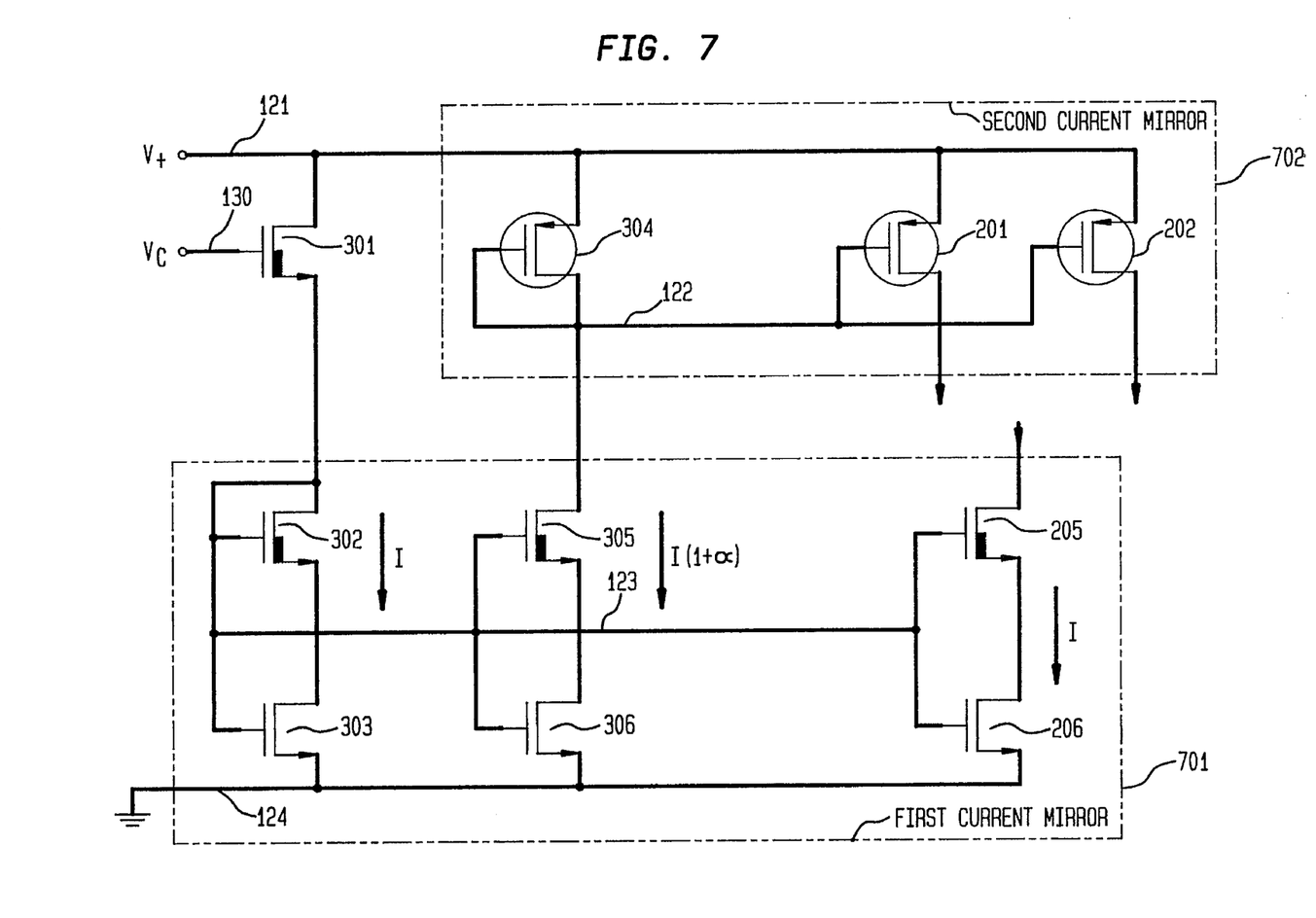
FIG. 7 is schematic diagram illustrating the relationship of the various components in the embodiment disclosed.

The relationship of the MOSFETs used to provide current sources and current sinks in all of the stages is illustrated in FIG. 7 wherein a first current mirror is shown as the dotted enclosure labeled 701 and a second current mirror is shown as the dotted enclosure labeled 702. Only the MOSFETs for differential amplifier stage 101 are shown. The current sources and sinks of the additional stages, 102–104, simply add on as secondary legs to the second and first current mirrors respectively.

It should be apparent to those skilled in the art, with a current of only I being conducted by the low conductance current sink of MOSFETs 205 and 206 in each of the stages, the current provided by each of the higher conductance MOSFETs 201 and 202 is equal on the average to a current of about I/2 in the balanced quiescent state. The impedance mismatching of the P-channel current sources and N-channel current sink in each stage of the oscillator provides stability against common mode lockup in the ring oscillator.

Figure 4:
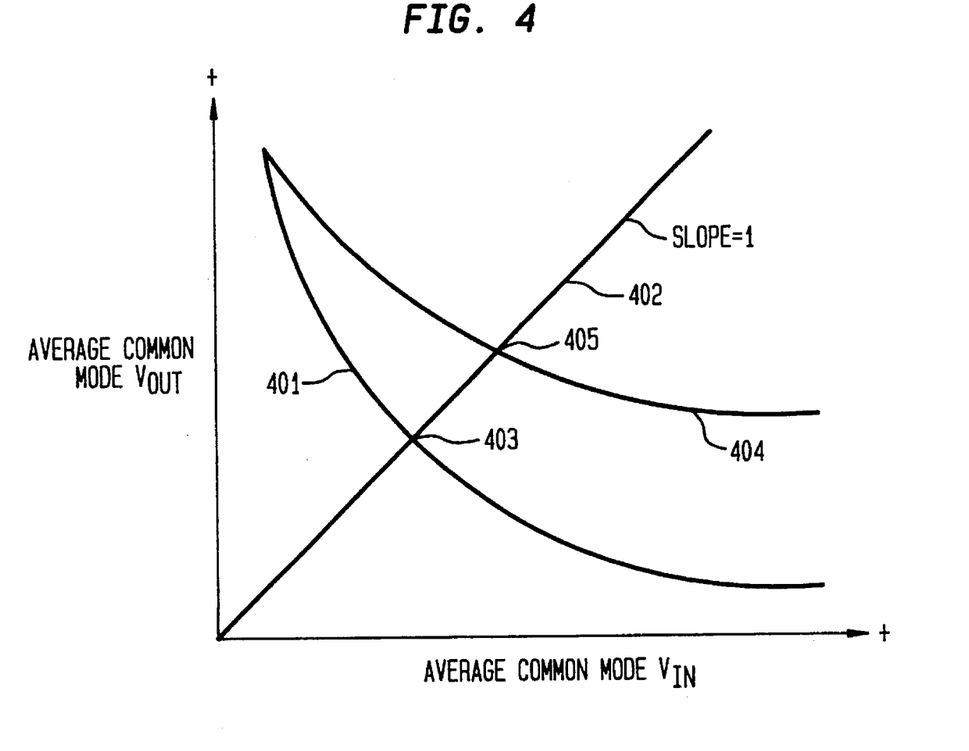
FIGS. 4, 5 and 6 are graphs useful in describing the operation of the embodiment disclosed.
Figure 6:
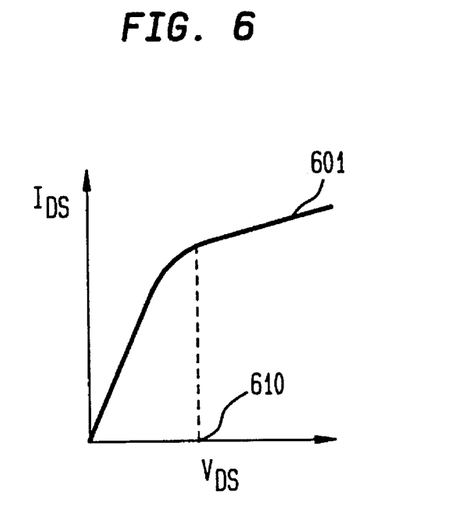

In FIG. 4, a curve 401 of the average common mode output voltage, $V_{out}$, versus average common mode input voltage, $V_{in}$, is shown for a prior art oscillator stage which has only a single MOSFET as a current sink in place of the one provided by cascoded MOSFETs 205 and 206 and for which ∝ is equal to zero. Briefly, curve 401 indicates the fact that if the average common mode input voltage is high in such a stage, the average common mode output voltage for the stage is low, and conversely, if the average common mode input voltage is low, the average common mode output voltage is high. Operation of such an oscillator stage can be described by referring to curve 601 of $I_{DS}$ versus $V_{DS}$ shown in FIG. 6 for a constant value of $V_{GS}$. As indicated in FIG. 6, even when a single MOSFET is operated at a constant $V_{GS}$ in the saturation region (that is, the region where $V_{DS}$ is to the right of 610 in FIG. 6), the current, $I_{DS}$, provided by the device is still not absolutely constant since the curve still has a nonzero slope. Accordingly, if the average common mode input voltage, $V_{IN}$, is reduced, the resulting drop in $V_{DS}$ across the single MOSFET device serving as a current sink will still result in a change in the currents being drawn through the MOSFETs serving as the differential pair. This drop in current also occurs in the MOSFETs serving as the current sources, thereby resulting in a drop in the VDS across these devices and therefore a rise in the average common mode output voltage, $V_{OUT}$. Of course, as the $V_{DS}$ across the device acting as the current sink drops even further causing the device to leave the saturation region (left of 610 in FIG. 6), this action occurs even more strongly, and curve 401 rises even more rapidly as the average common mode input voltage decreases.

Also shown in FIG. 4 is a curve 402 of unity slope. If all of the oscillator stages are equal in design and performance, a conventional ring oscillator should ideally operate with average input and output voltages at a point 403 representing the intersection of curves 401 and 402, that is, at the point where average common mode input and output voltages are equal. The slope of curve 401 ($dV_{OUT}/dV_{IN}$) represents the common mode gain of the stage. At point 403, the magnitude of the gain is at least 1, as shown in this example. This means that any perturbation which changes the average common mode voltage is not likely to be attenuated as it proceeds through the oscillator. Moreover, this perturbation may in fact be amplified, thereby causing the input and output common mode voltages to possibly proceed to a condition of common mode lockup.

Figure 5:
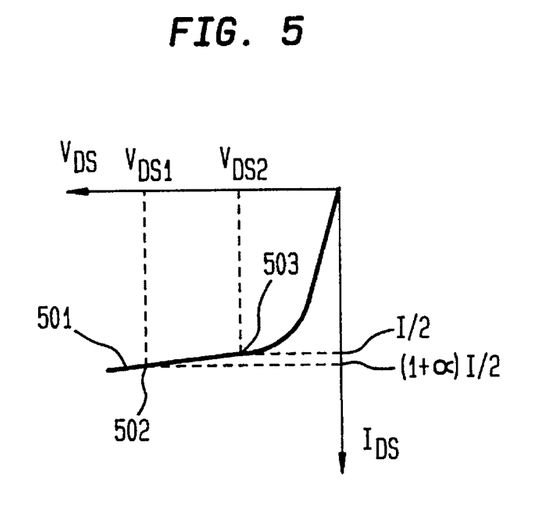

The relationship of the current between the drain and source, $I_{DS}$, versus the voltage between the drain and source, $V_{DS}$, for either of the P-channel MOSFETs 201 and 202 is given as curve 501 in FIG. 5 for a given value of gate-to-source potential, $V_{GS}$. This curve is drawn in the third quadrant since both $V_{DS}$ and $I_{DS}$ are negative for the P-channel MOSFETs. The value of $V_{GS}$ is, of course, established by the potential, $V_{BP}$, delivered to the stage by the bias control circuit 105. As pointed out hereinabove, this bias potential, $V_{BP}$, is established by the current mirror whose primary leg is MOSFET 304, and this bias causes each of the MOSFETs 201 and 202 (in the secondary leg of the current mirror) to attempt to operate as a current source which delivers a current equal to $(1+\infty)I/2$. This value of current would cause each MOSFET 201 and 202 to operate at point 502 on curve 501 of FIG. 5 corresponding to a drain-to-source potential of $V_{DS1}$. Since MOSFET 304 is connected as a diode and therefore its $V_{DS}$ equals its $V_{GS}$, $V_{DS}$ is greater in magnitude than ($V_{GS}-V_T$), and therefore MOSFET 304 is in the saturation region of the curve shown at point 502 in FIG. 5.

As also pointed out hereinabove, the low conductance current sink provided by MOSFETs 205 and 206 does not permit an average $I_{DS}$ current of more than about I/2 in each of the MOSFETs 201 and 202. Accordingly, the operating point of each MOSFET 201 and 202 must slide along the curve 501 to an operating point 503 which corresponds to an $I_{DS}$ equal to I/2 and a smaller voltage-to-source potential of $V_{DS2}$. As a result, the average common mode output potential is raised, and the relationship between average common mode output voltage and average common mode input voltage is as shown as curve 404 in FIG. 4. Operating MOSFETs 201 and 202 in the saturation region, instead of the triode region, is preferred (although not essential) since this reduces their susceptibility to power supply noise, and improves their ability to accommodate significant adjustments to frequency.

A reasonable choice for the value of ∝ (0.05 in the present embodiment) changes the Average Common Mode $V_{OUT}$ versus Average Common Mode $V_{IN}$ relationship to the one shown as curve 404 in FIG. 4. As indicated in FIG. 4, curve 402 having a unity slope intersects curve 404 in its flatter, lower gain region (as compared with the intersection of curve 401 in its more highly sloped region). The operating point 405 is at a point in curve 404 where the magnitude of the slope (i.e. magnitude of the gain) is less than one. In other words, $V_{OUT}$ changes less for a given change in $V_{IN}$. As a result, any perturbation in the average common mode potential is not amplified as it proceeds around the ring, but is in fact attenuated.

In addition, the much lower conductance of the current sink provided by the cascoded MOSFETs 205 and 206 results in a current versus voltage characteristic for the cascoded devices which is much flatter in the saturation region than the curve shown in FIG. 6 for a single device. As a result, with the cascoded circuit, curve 404 is flatter for average common mode input voltages sufficiently high to saturate devices 205 and 206.

Since curve 404 has a more limited negative excursion from operating point 405 (as compared with the negative excursion from point 403 in curve 401), the next stage will not see as negative an input common mode voltage, and thus its common mode output voltage will also be limited in its positive excursion from the operating point 405. As a result, the next stage will stay away from the near vertical part of the curve. Thus, the much lower conductance of the cascode N-channel MOSFET structure versus the P-channel MOSFETs contributes to the ∝-based sizing toward preventing the common mode lockup condition.

An additional advantage of the invention is that lowering the frequency of operation allows for reduced current dissipation (and therefore less power consumption).

What has been described hereinabove is an illustrative embodiment of the present invention. Numerous departures may be made by those skilled in the art without departing from the spirit and scope of the present invention. For example, the oscillator may be powered by a source having the opposite polarity and the MOSFETs replaced by their complementary types in which all current sources become current sinks, and vice versa. With the proper choice of polarities in the external power source and with proper choice of the channel types for the MOSFETs, the position of the current sources and current sinks can be interchanged without departing from the spirit and scope of the present invention. It should be understood that current sources and sinks have been so designated in the present specification and claims solely for the purposes of clarity in explanation of the theory of operation. Furthermore, the invention can be readily implemented using bipolar devices instead of some or all of the MOSFETs.

It should also be apparent to those skilled in the art that the mechanism for attempting to establish a current of (1+∝)I/2 in each of the current load devices (represented by MOSFETs 201 and 202) can include changing the channel W/L ratio of devices other than the ones described hereinbefore in connection with the preferred embodiment. For example, the additional secondary leg of the first current mirror could be constructed with MOSFETs having the same channel W/L ratios as the other secondary legs of said first current mirror (thereby delivering a current of I to the primary leg of the second current mirror), and the channel W/L ratios of the current load devices (MOSFETs 201 and 202) can be properly chosen relative to the channel W/L ratio in MOSFET 304 in order to practice the present invention. Thus, the redistribution of current gains and different current mirror topologies are within the scope of the invention.

What is claimed is:

1. A ring oscillator comprising:

an even number of differential stages connected in tandem with inputs connected to outputs in order to form a ring configuration, each of said stages including a pair of semiconductor devices connected in a differential amplifier configuration with two inputs, two outputs and a common connection, a common current device in each one of said stages connected to said common connection, a first current mirror having each of said common current devices connected as a secondary leg for establishing a current of I in said common current device, two load current devices in each of said stages each one of which is connected to a different one of said outputs, characterized in that said ring oscillator further includes a second current mirror having each of said load current devices connected as a secondary leg, said second current mirror being constructed for establishing a current of (1+∝)I/2 in each of said load current devices, and resulting in a current of I/2 in each of said load current devices, where ∝ is a number greater than zero.

2. A ring oscillator as defined in claim 1 wherein said common current devices are one of a current sink or current source, and said load current devices are the other of a current sink or current source.

3. A ring oscillator as defined in claim 2 wherein said first current mirror includes two MOSFETs connected in a cascoded structure as a primary leg with the source of one of said two MOSFETs being connected to the drain of the other of said two MOSFETs, and said first current mirror further includes two additional MOSFETs connected in a cascoded structure and connected as one of said secondary legs of said first current mirror, the two additional MOSFETs having channel W/L ratios that are larger by a factor of (1+∝) than the channel W/L ratios of the two MOSFETs in said primary leg.

4. A ring oscillator as defined in claim 3 wherein said common current devices in each of said stages comprises two MOSFETs connected in a cascoded structure and fabricated to be essentially identical in size to the two MOSFETs in said primary leg of said first current mirror.

5. A ring oscillator as defined in claim 4 wherein said load current devices in each of said stages each comprises a MOSFET of opposite polarity type to the MOSFETs in said common current devices, said second current mirror having a primary leg comprising a MOSFET of said opposite polarity type, and said MOSFET in said primary leg of said second current mirror being connected as a diode in series with said two additional MOSFETs connected in a cascoded structure.

6. A ring oscillator comprising:

an even number of differential stages connected in tandem to form a ring configuration, each of said stages including a pair of semiconductor devices connected in a differential pair configuration with a common connection, a current sink being connected to said common connection, and two current sources, each one of said two current sources being connected to deliver current to a different one of said semiconductor devices;

a controller circuit for setting a value of current in said current sink and said two current sources, said controller circuit including a primary leg of a first current mirror having a current of I, and a primary leg of a second current mirror having a current of (1+∝)I/2, where ∝ is a number greater than zero;

said current sink being connected as a secondary leg of said first current mirror, and said current sources being connected as secondary legs of said second current mirror.

7. A ring oscillator as defined in claim 6 wherein said first current mirror further includes an additional secondary leg having a current of (1+∝)I, and said additional secondary leg is connected as a source of current for said primary leg of said second current mirror.

8. A ring oscillator as defined in claim 7 wherein said primary leg of said first current mirror includes first and second MOSFETs connected in a cascode arrangement with the source of said first MOSFET connected to the drain of said second MOSFET, and said additional secondary leg includes third and fourth MOSFETs connected in a cascode arrangement, said third and fourth MOSFETs each having a channel width to length (W/L) ratio that is larger by a factor (1+∝) than the respective channel W/L ratio in said first and second MOSFETs.

9. A ring oscillator comprising:

an even number of differential stages connected in tandem to form a ring configuration, each of said stages including a pair of semiconductor devices connected in a differential pair configuration with a common connection, a current sink being connected to said common connection, and two current sources, each one of said two current sources being connected to deliver current to a different one of said semiconductor devices;

a controller circuit for setting a value of current in said current sink and said two current sources, said controller circuit including a primary leg of a first current mirror having a current of I;

said current sink of each stage being connected as a secondary leg of said first current mirror;

characterized in that said controller circuit includes a primary leg of a second current mirror, said current sources being connected as secondary legs of said second current mirror, and said first current mirror includes an additional secondary leg connected as a source of current of (1+∝)I for said primary leg of said second current mirror, where ∝ is a number greater than zero.

10. A ring oscillator as defined in claim 9 wherein said primary leg of said first current mirror includes first and second MOSFETs connected in a cascode arrangement with the source of said first MOSFET connected to the drain of said second MOSFET, and said additional secondary leg includes third and fourth MOSFETs connected in a cascode arrangement, said third and fourth MOSFETs each having a channel width to length (W/L) ratio that is larger by a factor of (1+∝) than the respective channel W/L ratio in said first and second MOSFETs.

11. A ring oscillator comprising a plurality of differential stages each one of which having first and second inputs and outputs, said stages being connected in tandem with inputs connected to outputs in order to form a ring configuration, each of said stages including two current sources and a current sink each of which having a bias input for receiving a bias potential that determines a value of its respective current;

and a bias control circuit for providing a first bias potential to the bias input for said current sources in all of said stages and a second bias potential to the bias input for said current sinks in all of said stages;

characterized in that said bias control circuit includes a first pair of semiconductor MOSFETs connected in a cascode arrangement with the source of one of said pair connected to the drain of the other of said pair to create a first junction, a circuit for providing a current of I into said cascoded first pair of MOSFETs, said second bias potential being derived from said first junction, a second pair of MOSFETs connected in a cascode arrangement to form a second junction, said second junction being directly connected to said first junction, said second pair of MOSFETs each having a channel width to length (W/L) ratio that is larger by a factor of $(1+\alpha)$ than the channel W/L ratio of said first pair of MOSFETs, where $\alpha$ is a number greater than zero, and a circuit responsive to a current in said cascoded second pair of MOSFETs for providing said first bias potential to the current sources in all of said stages.

12. A ring oscillator as defined in claim 11 wherein said first pair of MOSFETs are two N-channel MOSFETs each having a source, drain and gate, one of said two N-channel MOSFETs having its source connected to the drain of the other one of said two N-channel MOSFETs, said other one of said two MOSFETs having its source connected to a reference potential, the gate of said one of said two MOSFETs being directly connected to the gate of said other one of said two MOSFETs, said one of said two MOSFETs having a lower threshold voltage than said other one of said two MOSFETs, and said other one of said two MOSFETs adapted for operation in the saturation region.

13. A ring oscillator as defined in claim 11 wherein said circuit for providing said first bias potential and said current sources in each of said stages are both constructed of substantially identical P-channel MOSFETs having a source, drain and gate, the gates of said P-channel MOSFETs being directly connected, and the sources being connected to an external potential source.

14. A ring oscillator comprising a plurality of stages each of which having first and second inputs and outputs, said stages being connected in tandem to form a ring configuration, each of said stages including a differential amplifier having a first and second MOSFETs of a particular polarity channel type, said first and second MOSFETs each having a source, drain and gate, the sources of said first and second MOSFETs being connected together to form a common connection, said gates of said first and second MOSFETs serving as the first and second respective inputs of the stage represented by said differential amplifier, and the drains of said first and second MOSFETs serving as respective outputs of the stage represented by said differential amplifier, first and second current sources connected respectively to the drains of said first and second MOSFETs, a current sink connected to said common connection;

and a controlling circuit for controlling a value of current in said first and second current sources and current sink in all of said stages;

characterized in that said controlling circuit includes a primary leg of a first current mirror having a current of I in response to an external control potential, the current sink in each of said stages being connected as a secondary leg of said first current mirror;

an additional secondary leg of said first current mirror having a current of $(1+\alpha)I$, where $\alpha$ is a number greater than zero;

and a primary leg of a second current mirror connected to receive the current of $(1+\alpha)I$ from said additional secondary leg of said first current mirror, the current sources in each of said stages being connected as secondary legs of said second current mirror.

15. A ring oscillator as defined in claim 14 wherein said current sink in each of said stages comprises third and fourth MOSFETs having the same polarity channel type as said first and second MOSFETs and connected in a cascode arrangement with the source of the third MOSFET connected to the drain of the fourth MOSFET, the drain of said third MOSFET being connected to said common connection, and the source of said fourth MOSFET being connected to a reference potential, the gate electrodes of said third and fourth MOSFETs being provided with a biasing potential from the primary leg of said first current mirror.

16. A ring oscillator as defined in claim 15 wherein said third MOSFET has a lower threshold level than said fourth MOSFET, and said gate electrodes of said third and fourth MOSFETs are connected directly together.

17. A ring oscillator as defined in claim 16 wherein said first current source comprises a fifth MOSFET, said second current source comprises a sixth MOSFET, said fifth and sixth MOSFETs being of opposite polarity types to said first and second MOSFETs, the source electrodes of said fifth and sixth MOSFETs being connected to an external source of potential, and the gate electrodes of said fifth and sixth MOSFETs being connected to receive a bias potential from said primary leg of said second current mirror.

18. A ring oscillator as defined in claim 17 wherein said additional secondary leg of said first current mirror includes seventh and eighth MOSFETs connected in a cascode arrangement and connected as a secondary leg of said first current mirror, said seventh and eighth MOSFETs having channel width to length (W/L) ratios that are larger by a factor of $(1+\alpha)$ than the channel W/L ratios in said third and fourth MOSFETs.

19. A ring oscillator as defined in claim 18 wherein said primary leg of said second mirror includes a ninth MOSFET having a polarity channel type equal to said fifth and sixth MOSFETs, said ninth MOSFET including two MOSFETs that are connected in parallel and are substantially identical to said fifth and sixth MOSFETs.

20. A ring oscillator as defined in claim 19 wherein said primary leg of said first current mirror includes tenth and eleventh MOSFETs having the same polarity channel type as said third and fourth MOSFETs, said tenth MOSFET being connected in a diode structure with its drain being connected directly to its gate electrode, the source of said tenth MOSFET being connected to the drain of said eleventh MOSFET the source of which is connected to said reference potential.

21. A ring oscillator as defined in claim 20 wherein said controlling circuit further includes a twelfth MOSFET having its drain connected to said external potential source, its source connected to the drain of said tenth MOSFET, and its gate electrode connected to receive said external control potential.

* * * * *